United States Patent
Hsu et al.

(10) Patent No.: US 8,928,395 B2
(45) Date of Patent: Jan. 6, 2015

(54) VOLTAGE GENERATOR

(75) Inventors: Tzeng-Ju Hsu, Hsinchu County (TW); Ting-Kuo Yen, Hsinchu County (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 13/352,298

(22) Filed: Jan. 17, 2012

(65) Prior Publication Data
US 2013/0181766 A1    Jul. 18, 2013

(51) Int. Cl.
*G05F 1/10*  (2006.01)
*G05F 3/02*  (2006.01)

(52) U.S. Cl.
USPC .......................................................... 327/536

(58) Field of Classification Search
USPC .......................................................... 327/536
See application file for complete search history.

(56) References Cited

U.S. PATENT DOCUMENTS

| | | | | |
|---|---|---|---|---|
| 6,100,557 A * | 8/2000 | Hung et al. | .................... | 257/299 |
| 6,163,487 A * | 12/2000 | Ghilardelli | ............... | 365/189.09 |
| 6,292,048 B1 * | 9/2001 | Li | ................................. | 327/536 |
| 6,661,682 B2 * | 12/2003 | Kim et al. | ....................... | 363/59 |
| 6,693,483 B2 * | 2/2004 | Deml et al. | .................... | 327/536 |
| 6,914,791 B1 * | 7/2005 | Park et al. | ....................... | 363/60 |
| 7,030,683 B2 * | 4/2006 | Pan et al. | ....................... | 327/536 |
| 7,579,902 B2 * | 8/2009 | Frulio et al. | .................. | 327/536 |
| 2004/0130385 A1 * | 7/2004 | Shor et al. | ....................... | 327/536 |
| 2005/0189983 A1 * | 9/2005 | Sivero et al. | .................. | 327/536 |
| 2008/0079480 A1 * | 4/2008 | Utsunomiya | ................. | 327/536 |
| 2009/0134936 A1 * | 5/2009 | Chang et al. | .................. | 327/536 |
| 2010/0171544 A1 * | 7/2010 | Seo | ............................... | 327/536 |

FOREIGN PATENT DOCUMENTS

CN    1882895    12/2006

OTHER PUBLICATIONS

"Office Action of China Counterpart Application", issued on Jul. 25, 2014, p. 1-p. 6, in which the listed reference was cited.

* cited by examiner

*Primary Examiner* — Quan Tra
(74) *Attorney, Agent, or Firm* — Jianq Chyun IP Office

(57) ABSTRACT

A voltage generator adapted for a flash memory is disclosed. The voltage generator includes a charge pump circuit and a voltage regulator. The charge pump circuit includes at least one charge pump unit having a voltage receiving terminal and a voltage transmitting terminal. The voltage receiving terminal receives a reference voltage and the voltage transmitting terminal generates an output voltage. The charge pump unit includes first and second voltage transmitting channels and first and second capacitors. The first and second voltage transmitting channels are turned on or off according first and second control signals, respectively. The first and second capacitors receive the first and second pump enabling signals, respectively. The voltage regulator outputs a regulated output voltage according to the output voltage.

9 Claims, 4 Drawing Sheets

VOLTAGE GENERATOR

BACKGROUND OF THE INVENTION

1. Field of the Invention

The present invention relates to a voltage generator adapted for a flash memory.

2. Description of Related Art

In flash memories, for example, NOR flash memories, an internal voltage source is often required to provide an operating voltage. This voltage source is often generated through a charge pump circuit and a voltage regulator. The charge pump circuit is used to provide a relatively high output voltage to the voltage regulator, whereas the voltage regulator generates the power that the flash memory needs according to the output voltage.

Conventionally, the charge pump circuit generates the output voltage usually by multiplying the reference voltage by a fixed factor. In order to meet the maximum power need of the flash memory, the charge pump circuit is designed to provide a relatively high output voltage. However, when the power needed by the flash memory decreases, the output power generated by the charge pump circuit is not changed, which imperceptibly causes a waste of power. On the other hand, in such a case where there is a big difference between the output voltage received by the regulator and the voltage generated by the voltage regulator, a severe ripple phenomenon is occurred in the generated power. That is, the power generated by the voltage regulator mentioned above has a poor quality.

SUMMARY OF THE INVENTION

Accordingly, the present invention is directed to a voltage generator for a flash memory which can effectively reduce the ripple phenomenon and power consumption.

The present invention provides a voltage generator for a flash memory. The voltage generator includes a charge pump circuit and a voltage regulator. The charge pump circuit includes at least one charge pump unit. The charge pump unit has a voltage receiving terminal for receiving a reference voltage and a voltage transmitting terminal for outputting an output voltage. The charge pump unit includes first and second voltage transmitting channels, and first and second capacitors. The first voltage transmitting channel includes one terminal coupled to the voltage receiving terminal. The first voltage transmitting channel is turned on or off according to a first control signal. The first capacitor is connected in series between the voltage receiving terminal and a first pump enabling signal. The second voltage transmitting channel includes one terminal coupled to a second terminal of the first voltage transmitting channel. The second voltage transmitting channel is turned on or off according to a second control signal. The second terminal of the voltage transmitting channel is coupled to the voltage transmitting terminal. The second capacitor coupled between the second terminal of the first voltage transmitting channel and a second pump enabling signal in serial. The voltage regulator is coupled to the voltage transmitting terminal of the charge pump unit to receive the output voltage and output a regulated output voltage according to the output voltage.

In view of the foregoing, the present invention provides a voltage generator in which a charge pump circuit may adjust the value of its output voltage according to the value of the voltage needed by the flash memory to which the charge pump circuit belongs. As such, the charge pump circuit does not generate an unduly high output voltage that causes unduly high power consumption. In addition, during the process when the voltage regulator generating the regulated output voltage according to the output voltage, the voltage ripple can effectively reduced.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF THE EMBODIMENTS

Figure 1:
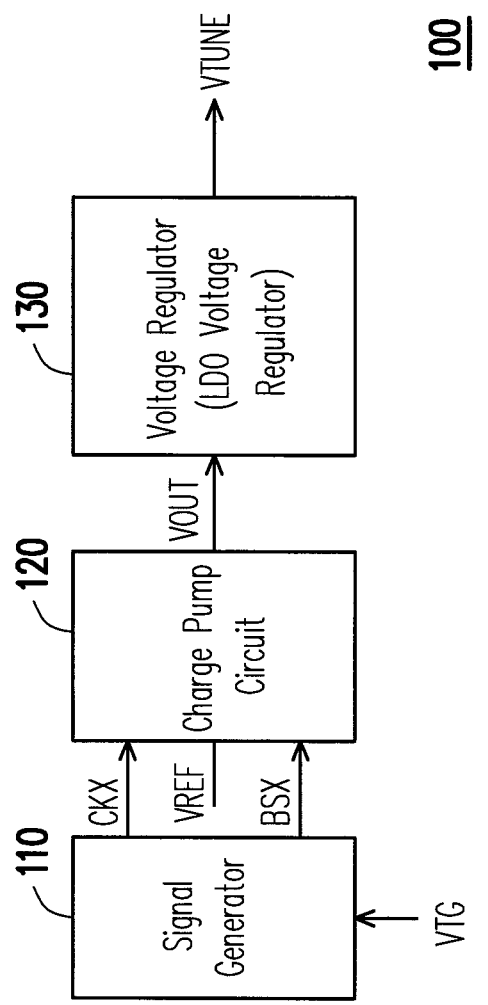
FIG. 1 illustrates a voltage generator according to one embodiment of the present invention.

FIG. 1 illustrates a voltage generator 100 according to one embodiment of the present invention. The voltage generator 100 is adapted for a flash memory (for example, an NOR flash memory), and includes a signal generator 110, a charge pump circuit 120 and a voltage regulator 130. In the present embodiment, the charge pump unit 120 receives a control signal group CKX and a pump enabling signal group BSX generated by the signal generator 110, and receives a reference signal VREF. The charge pump circuit 120 generates an output voltage VOUT by pulling up the reference signal VREF according to the control signal group CKX and the pump enabling signal group BSX.

It is noted that, in the present embodiment, the value of the output voltage VOUT can be varied by adjusting the pump enabling signal group BSX. The pump enabling signal group BSX and control signal group CKX are generated by the signal generator 110 according to the value of a target output voltage VTG. In general, the output voltage VOUT is approximately N times the reference voltage VREF, where N is an integer other than zero.

In addition, the voltage regulator 130 receives the output voltage VOUT generated by the charge pump circuit 120, generates a regulated output voltage VTUNE according to the output voltage VOUT, and provides the regulated output voltage VTUNE to circuits inside the flash memory for use. Notably, the regulated output voltage VTUNE is not higher than the output voltage VOUT, i.e. the voltage generator 130 may be a low drop-out (LDO) voltage regulator.

It is noted that, in the present embodiment, the target output voltage VTG is set to be equal to the regulated output voltage VTUNE generated by the voltage regulator 130 when in a steady state. As such, under the control of the pump enabling signal group BSX and control signal group CKX generated according to the target output voltage VTG, the output voltage VOUT generated by the charge pump circuit 120 will be approximate to and higher than the regulated output voltage VTUNE. This effectively reduces the power consumption as well as the ripple phenomenon that may occur in the regulated output voltage VTUNE.

Figure 2:
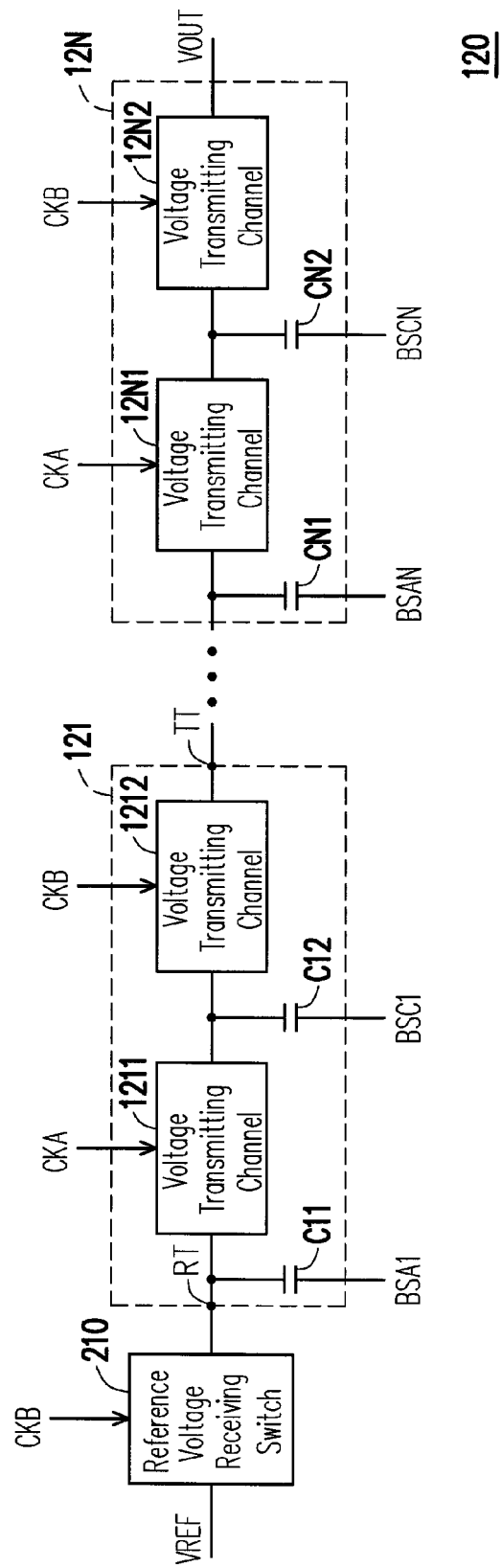
FIG. 2 illustrates one implementation of the embodiment of the charge pump circuit.

FIG. 2 illustrates one implementation of the embodiment of the charge pump circuit 120. The charge pump circuit 120 includes charge pump units 121 to 12N and a reference voltage receiving switch 210. The charge pump units 121 to 12N have the same circuit configuration. Taking the charge pump unit 121 as an example, the charge pump unit 121 includes voltage transmitting channels 1211, 1212 and capacitors C11, C12. One terminal of the voltage transmitting channel 1211 is coupled to a voltage receiving terminal, and another terminal of the voltage transmitting channel 1211 is commonly coupled to the capacitor C12 and the voltage transmitting channel 1212. The voltage transmitting channel 1211 receiving a control signal CKA and is turned on or off according to the control signal CKA. Another terminal of the voltage transmitting channel 1212 which is not coupled to the voltage transmitting channel 1211 is coupled to a voltage transmitting terminal. The voltage transmitting channel 1212 receiving a control signal CKB and is turned on or off according to the control signal CKB. In addition, one terminal of the capacitor C11 is coupled to a voltage receiving terminal RT, and the other terminal receives a pump enabling signal BSA1. One terminal of the capacitor C12 is coupled to a terminal at which the voltage transmitting channels 1211 and 1212 are coupled, and the other terminal receives a pump enabling signal BSC1.

By the way, the reference voltage receiving switch 210 is connected in series between the reference voltage VREF and the charge pump unit 121 for receiving the reference voltage VREF. The reference voltage receiving switch 210 receiving a control signal CKB and is turned on or off according to the control signal CKB. In addition, the voltage transmitting channels 1211 and 1212 do not turn on at the same time.

Figure 3A:
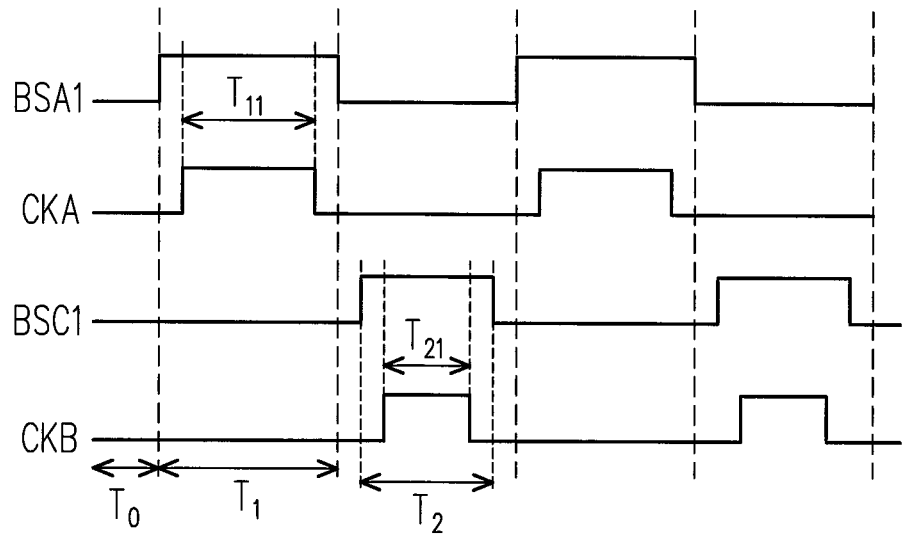
FIG. 3A is a waveform diagram of the charge pump circuit performing a forward pump action.

FIG. 3A is a waveform diagram of the charge pump circuit 120 performing a forward pump action. Referring to FIG. 2 and FIG. 3A, in an initial time interval T0, the reference voltage receiving switch 210 may be first turned on by means of the control signal CKB, such that the reference voltage VREF is transmitted to the voltage receiving terminal RT of the charge pump circuit 121 and stored in the capacitor C11. Then, in a time interval T1 following the initial time interval T0, the pump enabling signal BSA1 is pulled up from a low voltage level, and the voltage of the voltage receiving signal RT is pulled up. In addition, in a sub-time interval T11 of the time interval T1, the voltage transmitting channel 1211 is turned on according to the control signal CKA, such that charges are distributed between the capacitors C11 and C12, thereby pulling up the voltage at the coupling terminal between the voltage transmitting channels 1211 and 1212.

Afterwards, when the sub-time interval T11 ends, the voltage transmitting channel 1211 is turned off according to the control signal CKA. When the time interval T1 ends, the pump enabling signal BSA1 is restored to the low voltage level. In addition, in a time interval T2, the pump enable signal BSC1 is pulled up from the low voltage level, and the voltage at the coupling terminal between the voltage transmitting channels 1211 and 1212 is further pulled up by means of the capacitor C12. Besides, in a sub-time interval T21, the voltage transmitting channel 1212 is turned on according to the control signal CKB, through which the voltage at the coupling terminal between the voltage transmitting channels 1211 and 1212 is transmitted to the voltage transmitting terminal TT.

It is noted that the number of the charge pump units of the embodiment of the present invention may be one or more. More charge pump units can achieve more stages of voltage pulling. In each charge pump unit 121 to 12N, the control signals CKA and CKB received by the voltage transmitting channels 1211 to 12N1 and 1212 to 12N2 that are coupled at corresponding locations are the same, whereas the pump enable signals BSA1 to BSAN and BSC1 to BSCN received by respective capacitors C11 to CN1 and C12 to CN2 are different.

The number of the charge pump units may be determined by a maximum possible output voltage VOUT generated by the charge pump circuit 120. When the charge pump unit 120 needs not output the maximum possible output voltage VOUT, the output voltage VOUT may be determined according to whether the pump enable signal received by each stage of charge pump unit is pulled up or not. For instance, when the number of the charge pump units is five, and the output voltage VOUT that the charge pump circuit 120 needs to generate can be achieved by only three stages of the charge pump units, it is then possible to pull up the pump enable signals received by the first three stages of charge pump units, and maintain the pump enable signals received by the last two stages of charge pump units at the unchanged voltage level.

Figure 3B:
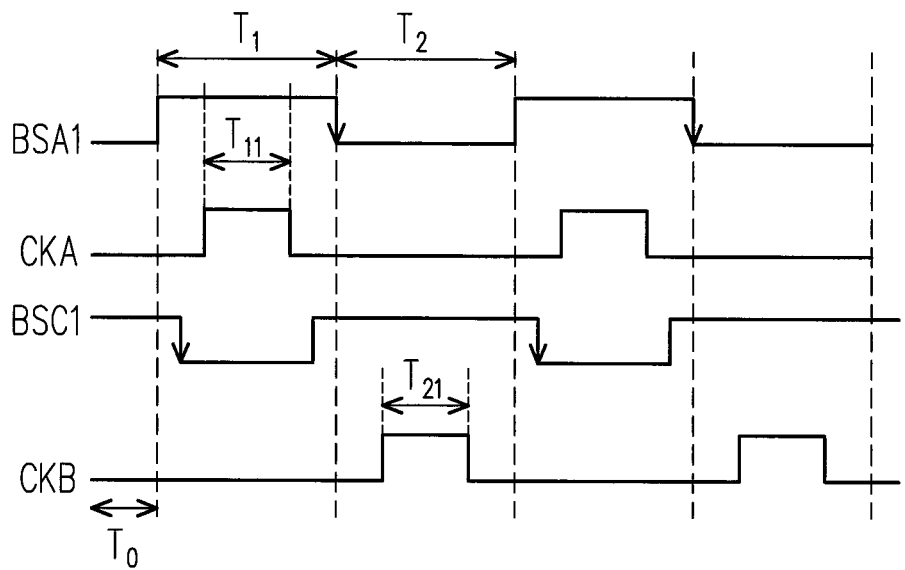
FIG. 3B is a waveform diagram of the charge pump circuit performing a backward pump action.

FIG. 3B is a waveform diagram of the charge pump circuit 120 performing a backward pump action. Referring to FIG. 2 and FIG. 3B, likewise, in an initial time interval T0, the reference voltage receiving switch 210 may be first turned on by means of the control signal CKB, such that the reference voltage VREF is transmitted to the voltage receiving terminal RT of the charge pump circuit 121 and stored in the capacitor C11. In the embodiment of FIG. 3B, the reference voltage VREF may be equal to a ground voltage (zero volt).

Then, in a time interval T1 following the initial time interval T0, the pump enabling signal BSA1 is pulled up from a low voltage level, and the pump enabling signal BSC1 is pulled down from a high voltage level and, in a sub-time interval T11 of the time interval T1, the voltage transmitting channel 1211 is turned on by means of the control signal CKA. As such, the capacitors C11 and C12 are directly connected to each other through the voltage transmitting channel 1211, and charges are distributed between the capacitors C11 and C12 according to a voltage difference between the pump enabling signals BSA1 and BSC1. In addition, at the moment that the time interval T1 ends and a time interval T2 starts, the voltage at the coupling terminal between the voltage transmitting channels 1211 and 1212 is pulled down by pulling down the pump enabling signal BSA1 and, in a sub-time interval T21 of the time interval T2, the voltage transmitting channel 1212 is turned on by means of the control signal CKB to transmit the pulled-down voltage at the coupling terminal between the voltage transmitting channels 1211 and 1212 to the voltage transmitting terminal TT.

As in the embodiment described with reference to FIG. 3A, the absolute value of the generated output voltage VOUT can be controlled by means of multiple stages of charge pump units 121 to 12N. In addition, the value of the output voltage VOUT generated by the charge pump circuit 120 according to the waveform of FIG. 3B is lower than zero.

Figure 4A:
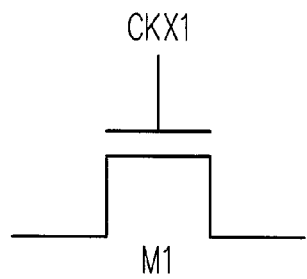
FIG. 4A and FIG. 4B illustrate different implementations of the voltage transmitting channel according to one embodiment of the present invention.
Figure 4B:
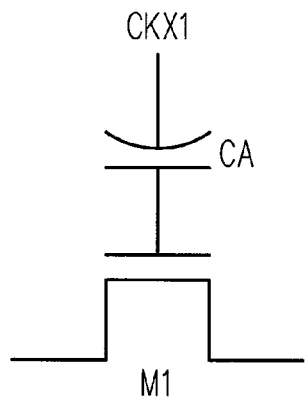

FIG. 4A and FIG. 4B illustrate different implementations of the voltage transmitting channel according to one embodiment of the present invention. As shown in FIG. 4A, the voltage transmitting channel is constructed by a transistor M1. A gate of the transistor M1 receives a control signal CKX1. When the transistor M1 is turned on according to the control signal CKX1, the transistor M1 transmits a voltage received at a source to a drain of the transistor M1. If taking the voltage transmitting channel 1211 as an example, the source of the transistor M1 is coupled to the voltage receiving terminal RT, and the drain is coupled to the voltage transmitting channel 1212. If taking the voltage transmitting channel 1212 as an example, the drain of the transistor m1 is coupled to the voltage transmitting terminal TT, and the source is coupled to the voltage transmitting channel 1211.

In addition, as shown in FIG. 4B, in addition to being constructed by a transistor M1, the voltage transmitting channel further includes a capacitor CA connected in series between the control signal CKX1 and the gate of the transistor M1 for receiving the control signal CKX1. That is, the control signal CKX1 is coupled to the transistor M1 through the capacitor CA to control turn-on or turn-off operation of the transistor M1.

Figure 5:
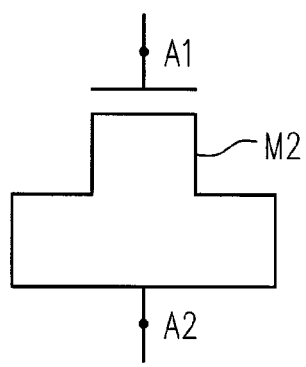
FIG. 5 illustrates an implementation of the capacitor according to one embodiment of the present invention.

FIG. 5 illustrates an implementation of the capacitor according to one embodiment of the present invention. The capacitors C11 to CN2 mentioned in the embodiment of the present invention can all be constructed by a transistor M2, namely, a transistor capacitor. The gate of the transistor M2 acts as a first electrode A1 of the capacitor, and the source and drain are connected to each other as a second electrode A2 of the capacitor.

In summary, the present invention dynamically adjusts the value of the output voltage generated by the charge pump circuit by adjusting the pump enable signals of various stages of the charge pump units, such that the value of the output voltage generated by the charge pump circuit is not too much higher than the regulated output voltage generated by the voltage regulator, thereby reducing excessive power consumption and reducing the ripple phenomenon in the regulated output voltage.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A voltage generator adapted for a flash memory, comprising:
    a charge pump circuit comprising at least one charge pump unit, the charge pump circuit having a voltage receiving terminal for receiving a reference voltage and a voltage transmitting terminal for outputting an output voltage, and the charge pump unit comprising:
        a first voltage transmitting channel having one terminal coupled to the voltage receiving terminal, the first voltage transmitting channel being turned on or off according to a first control signal;
        a first capacitor connected in series between the voltage receiving terminal and a first pump enabling signal;
        a second voltage transmitting channel having one terminal coupled to a second terminal of the first voltage transmitting channel, the second voltage transmitting channel being turned on or off according to a second control signal, a second terminal of the second voltage transmitting channel being coupled to the voltage transmitting terminal; and
        a second capacitor, coupled between the second terminal of the first voltage transmitting channel and a second pump enabling signal in serial;
    a voltage regulator coupled to the voltage transmitting terminal of the charge pump unit to receive the output voltage and output a regulated output voltage according to the output voltage; and
    a signal generator coupled to the charge pump circuit, receiving a target output voltage, and configured for generating the first and second control signals and the first and second pump enabling signals according to the target output voltage,
    wherein the first pump enabling signal is enabled during a first enabling period, and the second pump enabling signals is enabled during a second enabling period, wherein the first and second enabling periods does not overlap and are different in length, wherein the first control signal having a third enabling period is enabled within the first enabling period, and the second control signal having a fourth enabling period is enabled within the second enabling period, wherein the enabling of the first control signal is delayed as compared to the first pump enabling signal, and the second control signal is delayed as compared to the second pump enabling signal,
    wherein the output voltage is dynamically adjusted by respectively adjusting the first pump enabling signal and the second pump enabling signal, so that the output voltage is close to the regulated output voltage.

2. The voltage generator according to claim 1, wherein the first and second control signals are periodic pulse signals.

3. The voltage generator according to claim 1, wherein the first voltage transmitting channel and the second voltage transmitting channel are not turned on at the same time.

4. The voltage generator according to claim 1, further comprising a reference voltage receiving switch connected in series between the reference voltage and the voltage receiving terminal for receiving the reference voltage, the reference voltage receiving switch being turned on or off according to the second control signal.

5. The voltage generator according to claim 1, wherein the first voltage transmitting channel comprises:
    a first transistor having a first terminal, a second terminal and a control terminal, the control terminal adapted for receiving the first control signal, the first and second terminals coupled to the voltage receiving terminal and the second capacitor, respectively;
    the second voltage transmitting channel comprising:
    a second transistor having a first terminal, a second terminal and a control terminal, the control terminal adapted for receiving the second control signal, the first and second terminals coupled to the second capacitor and the voltage transmitting terminal, respectively.

6. The voltage generator according to claim 5, wherein the first voltage transmitting channel further comprises:
    a third capacitor connected in series between the first control signal and the first transistor for receiving the first control signal,
    the second voltage transmitting channel further comprising:
    a fourth capacitor connected in series between the second control signal and the second transistor for receiving the second control signal.

7. The voltage generator according to claim 1, wherein each of the first and second capacitors is a transistor capacitor.

8. The voltage generator according to claim 1, wherein the voltage regulator is a low drop-out voltage regulator.

9. A voltage generator adapted for a flash memory, comprising:
    a charge pump circuit comprising a plurality of charge pump units coupled in series, the charge pump circuit having a voltage receiving terminal for receiving a reference voltage and a voltage transmitting terminal for outputting an output voltage, and each of the charge pump units comprising:
        a first voltage transmitting channel having one terminal coupled to the voltage receiving terminal, the first voltage transmitting channel being turned on or off according to a first control signal;

a first capacitor connected in series between the voltage receiving terminal and a first pump enabling signal;

a second voltage transmitting channel having one terminal coupled to a second terminal of the first voltage transmitting channel, the second voltage transmitting channel being turned on or off according to a second control signal, a second terminal of the second voltage transmitting channel being coupled to the voltage transmitting terminal; and a second capacitor, coupled between the second terminal of the first voltage transmitting channel and a second pump enabling signal in serial;

a voltage regulator coupled to the voltage transmitting terminal of the charge pump unit to receive the output voltage and output a regulated output voltage according to the output voltage; and a signal generator coupled to the charge pump circuit, receiving a target output voltage, and configured for generating the first and second control signals and the first and second pump enabling signals according to the target output voltage, wherein the first pump enabling signal is enabled during a first enabling period, and the second pump enabling signals is enabled during a second enabling period, wherein the first and second enabling periods does not overlap and are different in length, wherein the first control signal having a third enabling period is enabled within the first enabling period, wherein the enabling of the first control signal is delayed as compared to the first pump enabling signal, and the second control signal is delayed as compared to the second pump enabling signal, wherein, when the output voltage is generated by utilizing only a portion of the charge pump units of the charge pump circuit, the first and second pump enabling signals received by the portion of the charge pump units of the charge pump circuit is enabled and the first and second pump enabling signals received by a remaining part of the charge pump units of the charge pump circuit is maintained at unchanged voltage level.

* * * * *